United States Patent
Nakamura

(10) Patent No.: US 6,295,628 B1
(45) Date of Patent: *Sep. 25, 2001

(54) LOGIC SYNTHESIS METHOD AND DEVICE USING SIMILAR CIRCUIT EXTRACTION

(75) Inventor: Atsushi Nakamura, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/885,898

(22) Filed: Jun. 30, 1997

(30) Foreign Application Priority Data

Jun. 28, 1996 (JP) .................................................. 8-188268

(51) Int. Cl.$^7$ ..................................................... G06F 17/50
(52) U.S. Cl. ..................................... 716/2; 716/3; 716/18
(58) Field of Search ................................... 364/488, 489, 364/490, 491; 716/18, 2, 3

(56) References Cited

U.S. PATENT DOCUMENTS

| | | | | |
|---|---|---|---|---|
| 4,882,690 | * | 11/1989 | Shinsha et al. .......................... | 364/490 |
| 5,402,357 | * | 3/1995 | Schaefer et al. ....................... | 364/490 |
| 5,416,719 | * | 5/1995 | Pribetich ............................... | 364/489 |
| 5,436,849 | * | 7/1995 | Drumm ................................ | 364/490 |
| 5,572,437 | * | 11/1996 | Rostoker et al. ....................... | 364/489 |
| 5,721,690 | * | 2/1998 | Asaka .................................... | 364/489 |
| 5,726,902 | * | 3/1998 | Mahmood et al. ..................... | 364/489 |
| 5,751,596 | * | 5/1998 | Ginetti et al. ......................... | 364/491 |
| 5,856,926 | * | 1/1999 | Matsumoto et al. ................... | 716/18 |

FOREIGN PATENT DOCUMENTS 6-259497  *  9/1994  (JP) .
7-334539  *  12/1995  (JP) .

* cited by examiner

*Primary Examiner*—Matthew Smith
*Assistant Examiner*—Vuthe Siek
(74) *Attorney, Agent, or Firm*—Young & Thompson

(57) ABSTRACT

A logic synthesizer includes a circuit analyzer for reading hardware function operation descriptions in hardware description language to translate the same into internal circuit expressions, a memory for storing circuits, common part information and restriction information, a hierarchically low level separator for separating hierarchically low level information that is commonly referenced, an output device for outputting a synthesis result, an optimization device for optimization processing, and a restriction condition input device for inputting restriction conditions. The circuit analyzer includes a basic analyzing device for basic analysis of the hardware descriptions, a similar description extraction element for extracting common and similar descriptions, and a hierarchically low level common device for translating the extracted common descriptions into common reference form at a hierarchically low level.

2 Claims, 16 Drawing Sheets

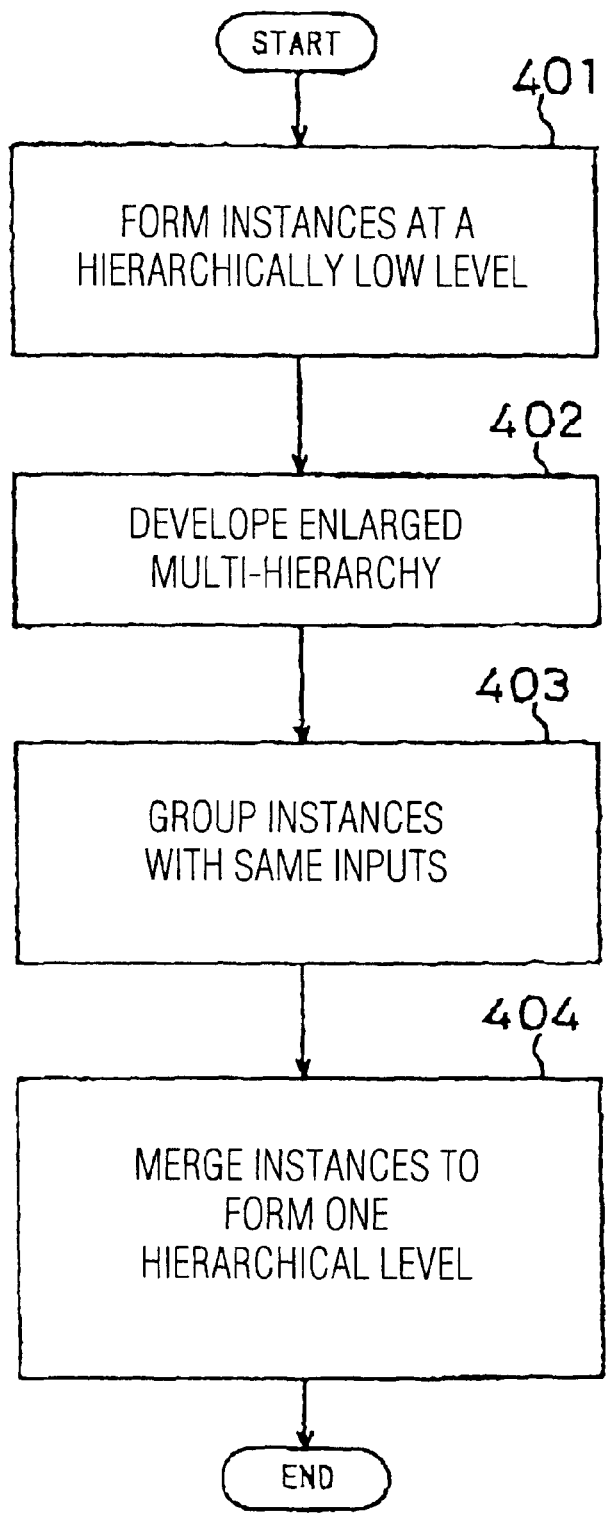

```
always
  case(a)
   0:
      if(b)                              ─601
        x=(p&-q)|(-r& s);
      else
        x=(-p& q)|(r&-s);
   1:
      if(b)
        x=(p&-q)|(-r& s);
      else
        x=(-p& q)|(r&-s);                ─602
  endcase always
      if(b)                              ─603
        y=(p|-q&-r)& s;
      else
        y=(-p|q& r)|-s;

always
      if(b)
        z=(p|-q&-r)& s ;
      else
        z=(-p|q& r)|-s ;                 ─604
```

(a) Descriptions (b) hierarchy before merge operation (c) hierarchy after merge operation FIG. 11A
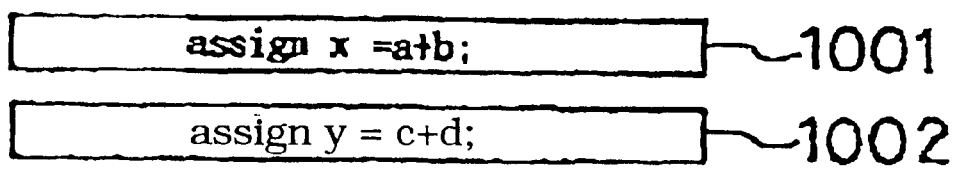
FIG. 11B
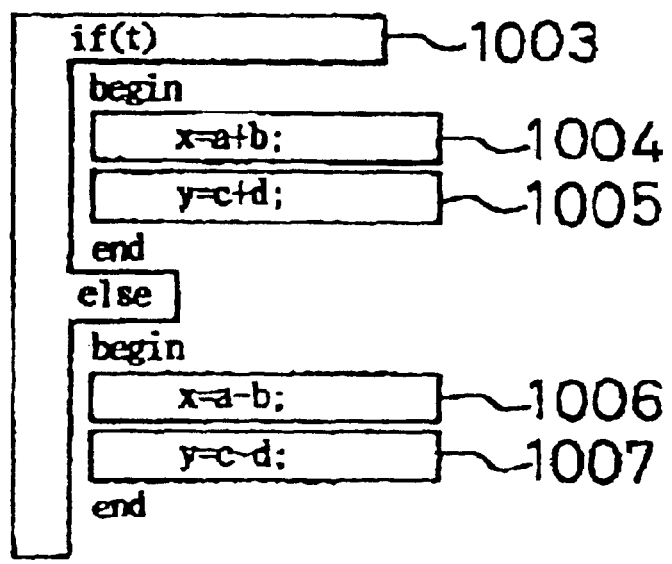
FIG. 12A
$$x = (a + b) + (c + d) + (e + f)$$

LOGIC SYNTHESIS METHOD AND DEVICE USING SIMILAR CIRCUIT EXTRACTION

BACKGROUND OF THE INVENTION

The present invention relates to a method of optimizating logic synthesis, and more particularly to a method of logic synthesis using common and similar circuit extraction applicable to a large scale integrated circuit.

One of the conventional logic synthesis techniques is an operator sharing method wherein hardware descriptions at a resistor transfer level and operations not commonly executed are commonly held by switching with a multiplexer to reduce the number of the necessary arithmetic logic circuits.

Japanese laid-open patent publication No. 2-171862 discloses that common parts in the descriptions are extracted and defined as function macros and then transformed into a common reference form at a hierarchically low level so that an optimization process is executed only at the hierarchically low level to shorten the optimization processing time. Other cases are not commonly optimized even when a plurality of similar circuits exist.

In the above operator sharing system, arithmetic operations and hardware functions to be concurrently executed are not common subject matter. This means that it is impossible to shorten the optimization processing time.

The logic synthesis disclosed in the Japanese laid-open patent publication No. 2-171862 has an object to obtain simple and clear synthesis results in the circuit-divisional. method but is not intended to prevent deterioration of the optimization performance.

In the optimization processes, there are processes for which boundary conditions should be considered. The boundary conditions are largely different for every instance and optimal results might be not obtainable simply with reference to the hierarchically low level.

In the general logic synthesis other than the above, when a plurality of similar partial circuits exist in a large scale integrated circuit, various optimization processes are made to each partial circuit without common processing. This needs a long time for processing.

In the above circumstances, it had been required to develop a novel logic synthesis apparatus and method of logic synthesis wherein common and similar partial circuits are extracted from a large scale integrated circuit to shorten an optimization processing time without deterioration of optimization performance.

SUMMARY OF THE INVENTION

Accordingly, it is an object of the present invention to provide a novel logic synthesis apparatus free from the above disadvantages.

It is a further object of the present invention to provide a novel logic synthesis apparatus, wherein common and similar partial circuits are extracted from a large scale circuit to shorten optimization processing time without. deterioration of optimization performance.

It is furthermore an object of the present invention to provide a novel method of logic synthesis free from the above disadvantages.

It is still a further object of the present invention to provide a novel method of logic synthesis, wherein common and similar partial circuits are extracted from a large scale circuit to shorten optimization processing time without deterioration of optimization performance.

The above and other objects, features and advantages of the present invention will be apparent from the following descriptions.

In order to achieve the above objects, a novel logic synthesizer comprises a circuit analyzer for reading hardware function operation descriptions in hardware description language to translate the same into internal circuit expressions, a memory for storing circuits, common part information and restriction information, a hierarchically low level separator for separating hierarchically low level information being commonly referred, an output device for outputting a synthesis result, an optimization device for optimization process, and a restriction condition input device for inputting restriction conditions, wherein the circuit analyzer comprises a basic analyzing device for basic analysis of the hardware descriptions, a similar description extraction for extracting common and similar descriptions and a hierarchically low level common device for translating the extracted common descriptions into common reference form at a hierarchically low level.

A novel method of optimization of logic synthesis comprises the steps of inputting hardware function operation descriptions in hardware description language, extracting common logics from the inputted logical information to translate the common logics into a common reference form at a hierarchically low level, merging common logics including common inputs, executing a first logical optimization for common logics extracted, separating the first optimized common logics, and executing a second logical optimization to the separated common logics.

BRIEF DESCRIPTIONS OF THE DRAWINGS

Preferred embodiments according to the present: invention will be described in detail with reference to the accompanying drawings.

FIG. 5 is a flow chart illustrative of a hierarchical structures modification processes in a first embodiment according to the present invention.

FIG. 11 is a view illustrative of neighboring and enlarging processes in embodiments according to the present invention.

PREFERRED EMBODIMENTS

Figure 1:
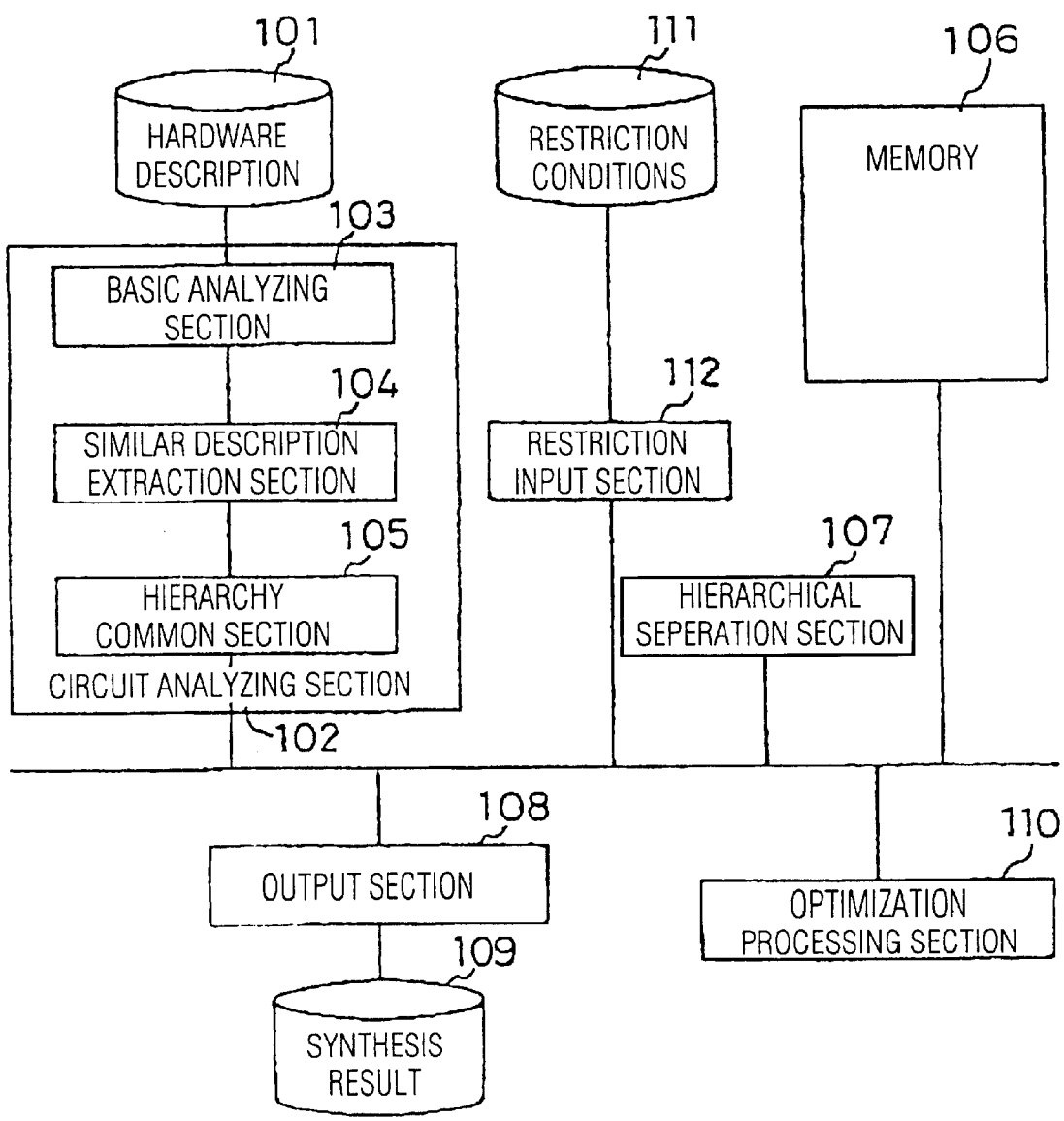
FIG. 1 is a block diagram illustrative of a logic synthesis system in a first embodiment according to the present invention.

A first embodiment according to the present invention will be described with reference to FIG. 1. A logical synthesis system in accordance with the first embodiment of the present invention comprises the following elements. A circuit analyzing section 102 is provided for reading hardware description languages 101 which describes hardware function operations. A memory 106 is provided for storing common partial circuit information and restriction conditions. A low level hierarchical separation section 107 is provided for separating at a low level hierarchy information commonly referenced. An output section 108 is provided for outputting a synthesis result 109. An optimization processing section 110 is provided for optimization processing. A restriction input section 112 is provided for inputting restriction conditions 111. The circuit analyzing section 102 comprises a basic analyzing section 103 for basic analysis of the hardware descriptions, a similar description extraction section 104 for extracting common and similar descriptions and a low level hierarchy common section 105 for translating the extracted common descriptions into common reference form at a low level in hierarchy.

Figure 13:
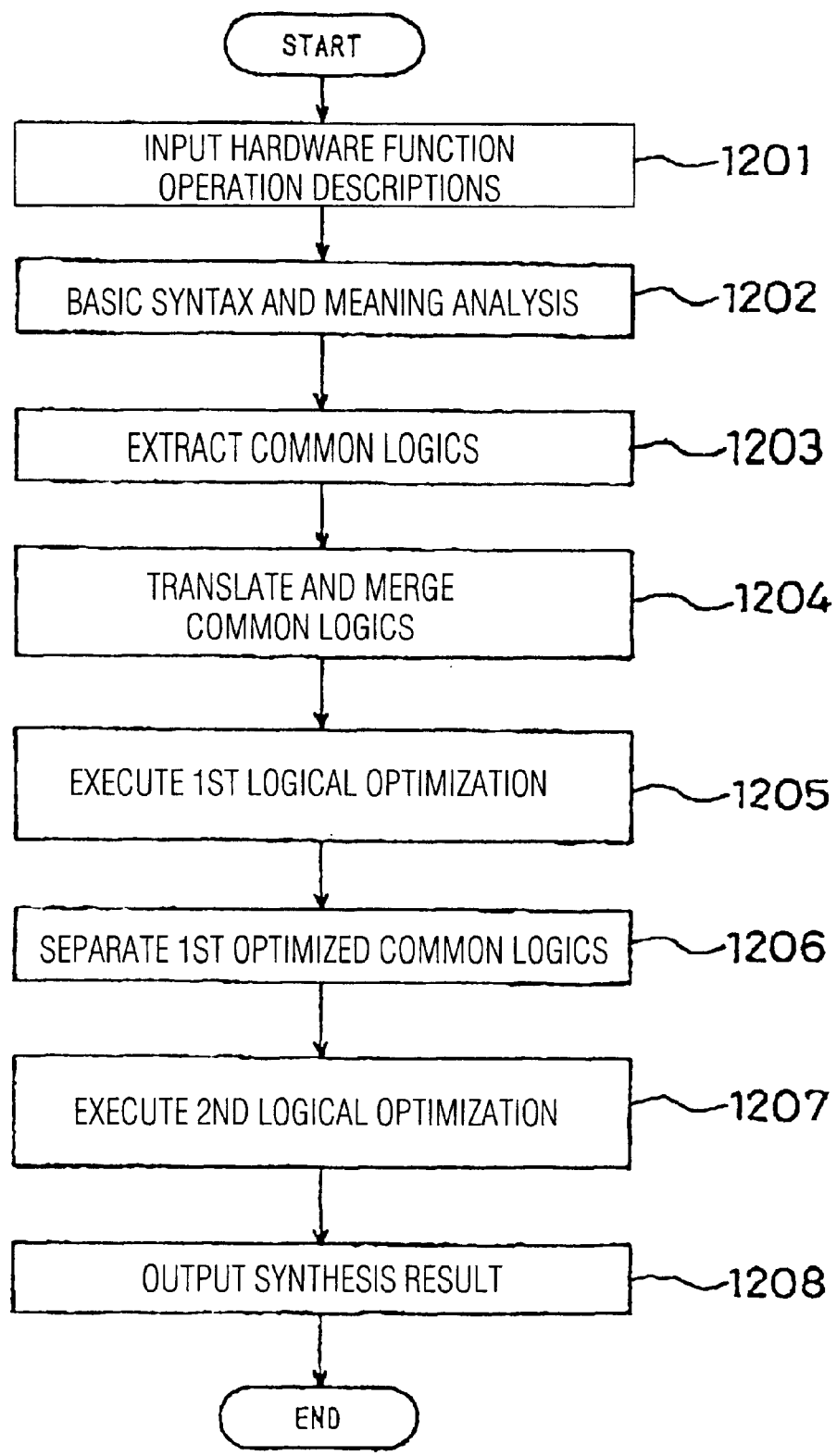
FIG. 13 is a flow chart illustrative of total processes in a first embodiment according to the present invention.

With reference to FIG. 13, a novel method of optimization of logic synthesis comprises the steps of inputting (step 1201) hardware function operation descriptions in hardware description language, extracting (step 1203) common logics from the inputted logical information, translating (step 1204) the common logics into a common reference form at a hierarchically low level and merging common logics including common inputs, executing (step 1205) a first logical optimization for common logics extracted, separating (step 1206) the first optimized common logics, and executing (step 1207) a second logical optimization to the separated common logics.

In the first embodiment according to the present invention, the hardware descriptions are analyzed to extract common parts so as to be temporarily and commonly referenced at a low level in hierarchy.

Figure 6:
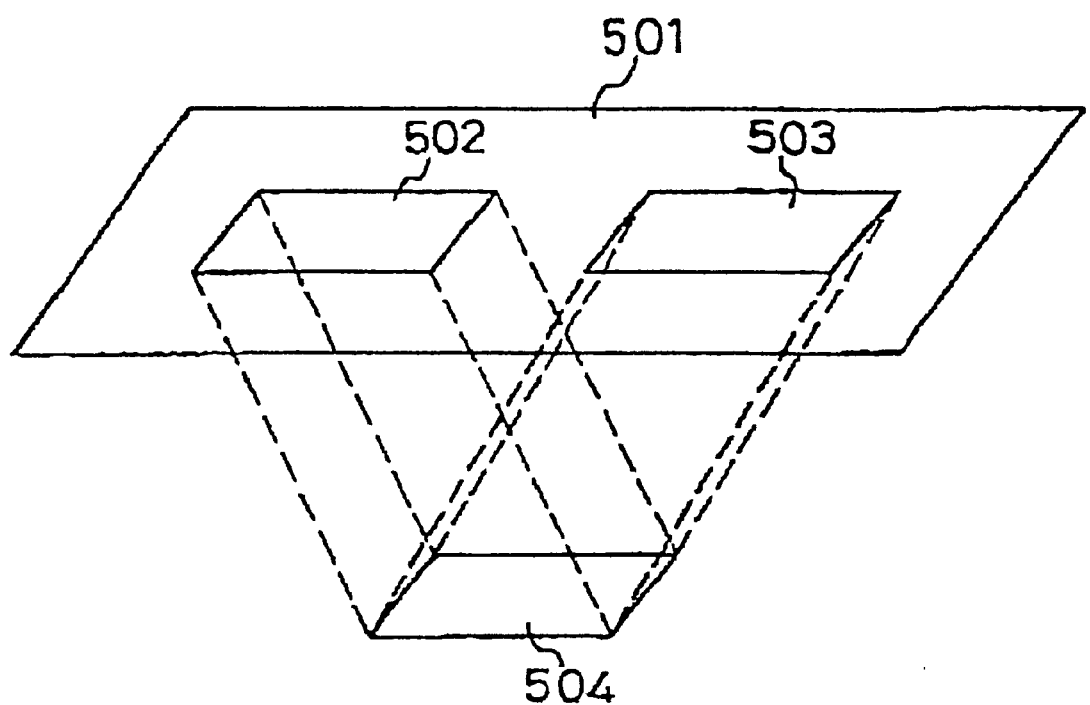
FIG. 6 is a view illustrative of a hierarchical structures in view of a low level hierarchical common reference in a first embodiment according to the present invention.

With reference to FIG. 6, a high level in hierarchy has an instance which refers to a low level in the hierarchy so that each instance refers to a low level in hierarchy defining its function. There are instances 502 and 503 belonging to a hierarchically high level. The instances 502 and 503 commonly refer to a hierarchically low level. This state is denoted "common reference to a hierarchically low level".

Figure 8:
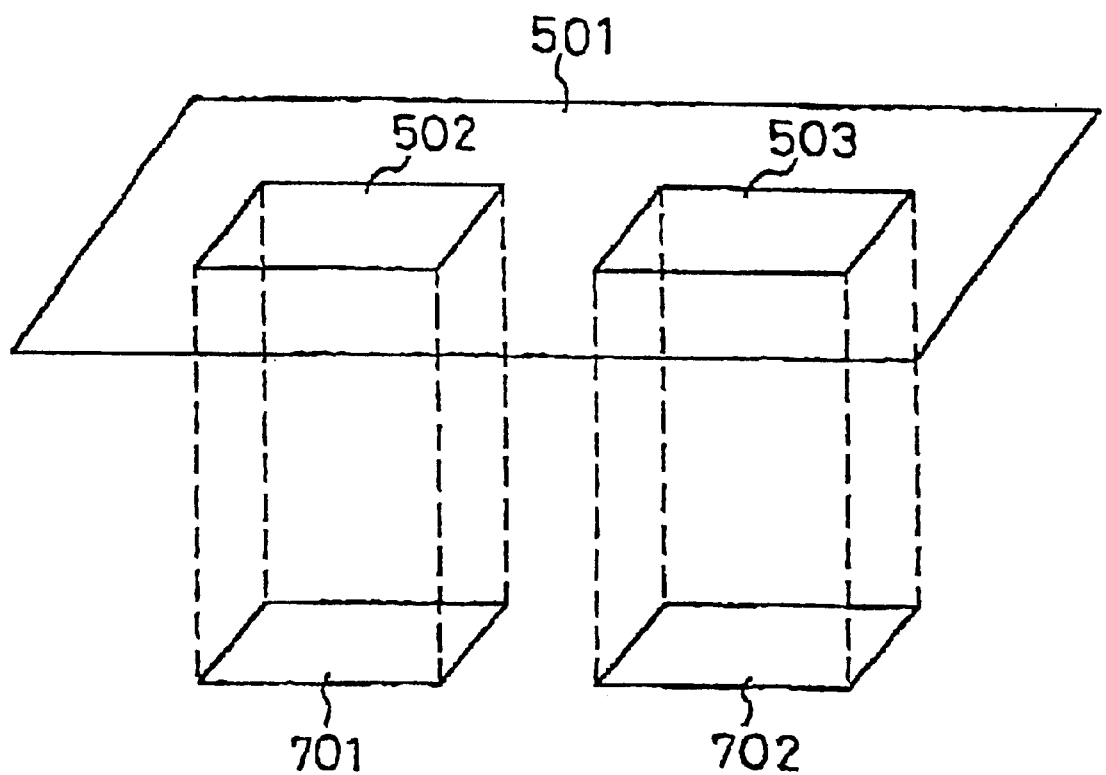
FIG. 8 is a view illustrative of a hierarchical structures in view of separation in a first embodiment according to the present invention.

With reference to FIG. 8, instances 502 and 503 belonging to a hierarchically high level 501 indicate hierarchically low levels 701 and 702. The instances 502 and 503 refer to different hierarchically low levels.

Separation of the hierarchically low level will be described with reference again to FIG. 6. In the state of "common reference to a hierarchically low level", the hierarchically low level is copied to form the same number of the hierarchically low levels as the instances for one-to-one reference as illustrated in FIG. 8. This is called separation.

For the signal interfaces between the levels in hierarchy, each level has boundary conditions including interdriving ability, capacity and delay restrictions and other boundary conditions.

In FIG. 6, even though the instances 502 and 503 refer to the same low level in hierarchy, the instances 502 and 503 respectively have separate boundary conditions. If the boundary conditions are largely different from each other, it is difficult to execute optimization process highly dependent upon the boundary condition by adjusting both the different boundary conditions. If in the common reference state, delay optimization is made to a critical path beyond the boundary against the hierarchically low level 504, this optimization made be regarded to be an optimization process highly dependent upon the boundary condition.

By contrast, as illustrated in FIG. 8, if separation has been made, the hierarchically low levels 702 and 703 referred by the instances 502 and 503 are separated, for which reason it is possible to execute separate optimization s to adjust to t he respective boundary conditions.

For example, if the adders are synthesized, ripple carry adder is used for reducing the area while carry look ahead is used for shortening the delay time. If the hierarchically low levels are separated, it is possible to select adders that are adjustable for the respective boundary conditions.

If the optimization shortens the delay time of each path of the circuits having the same functions, it is general that an increase in the number of paths with shortened delay time causes an increase in the area.

With reference to FIG. 6, there are instances 502 and 503 commonly referring to the same hierarchically low level 504 which has a plurality of paths P1 and P2. Under the boundary conditions, the first instance 502 requires a large reduction in delay of the path P1 while the second instance 503 requires a large reduction in delay of the path P2. In this case, in order to optimize the delay of the hierarchically low level 504, the area is increased by the shortening the delay of both the paths P1 and P2. If, however, as illustrated in FIG. 8, the hierarchically low level is separated, the area of the first hierarchically low level 701 is increased by the reduction in delay of the path Pi while the area of the second hierarchically low level 702 is increased by the reduction in delay of the path P2. It is possible to suppress the increase in total area.

On the other hand, an optimization process least dependent on the boundary conditions, such as logical optimization in technology independent of level, results in almost the same processing contents as the hierarchically low level for which reason as illustrated in FIG. 6, the optimization process is completed one time to shorten the processing time.

In recent years, IEEE1076 (VHDL) and IEEE1364 (Verilog HDL) have been widely used as a typical hardware descriptions.

Generally, the hardware descriptions comprise condition branches and equations. The equations comprise operands and operators and are classified into condition equations and substitution equations.

Further the hardware descriptions are sectioned into blocks of even processes and conditional branches and most of the conditional branches have a nested structure.

The equations and conditional branches commonly executed under the same conditions are called "adjacent", while the equations and conditional branches not commonly executed under the same conditions are called "not adjacent".

For example, in FIG. 11A, the substitution equation (assign x=a+b;)1001 and the substitution equation (assign y=c+d;)1002 are adjacent.

For example, in FIG. 11B, the substitution equation (assign x=a+b;)1004 and the substitution equation (assign y=c+d;)1005 are executed when the conditional equation is satisfied or variation t is true. The equations are thus adjacent.

For example, in FIG. 11B, the substitution equation (assign x=a−b;)1006 and the substitution equation (assign y=c−d;)1007 are executed when the conditional equation is satisfied or variation t is false. The equations are thus adjacent.

For example, in FIG. 11B, the substitution equation (assign x=a+b;)1004 and the substitution equation (assign x=a−b;)1006 are executed under different conditions. The equations are thus not adjacent.

A condition branch and an equation to be executed under the conditions thereof are considered to be adjacent.

For example, in FIG. 11B, the condition branch 1003 and the substitution equation 1004 are executed under the conditions of condition branch (t) and the variation t is true. The branch and equation are thus adjacent.

For example, in FIG. 11B, the condition branch 1003 and the substitution equation 1006 are executed under the conditions of condition branch (t) and the variation t is false. The branch and equation are thus adjacent.

The following description will focus on the division of the equations. The equation in general may be expressed in a digraph wherein nodes of operands and operators are connected via edges in a sequence of operations.

Figure 12C:
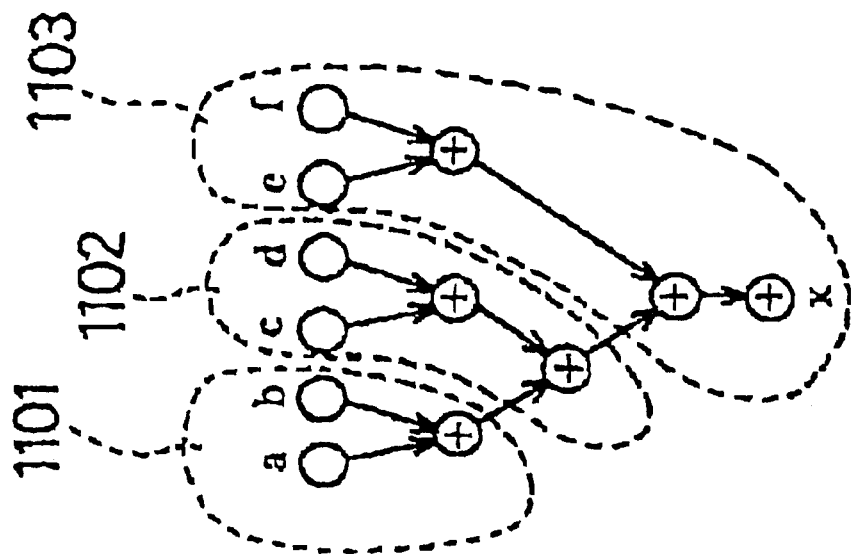
FIG. 12 is a view illustrative of division of equations in embodiments according to the present invention.
Figure 12B:
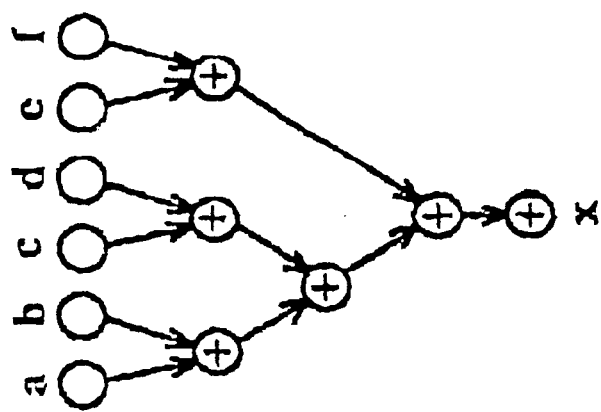

For example, the equation of FIG. 12A may be expressed as the graph of FIG. 12B. If the graph is divided, this means the equation is to be divided. The equation of FIG. 12A may be divided into the partial equations 1101, 1102 and 1103. The partial equations after being divided are called processing units.

Common partial equations will be described.

In FIG. 12C, the partial equations 1102 and 1103 are common in structure, independent from whether the input signals are different or identical and both may be concurrently executed. If the equations are different in bit width, both are considered to be common, provided the one with the largest bit width includes another of less bit width. For example, an, addition of 15bits—2input—15bits output includes an addition of 12bits—2input—12bits output.

Enlargement will be described.

Grouping adjacent process units which have been considered to be common in structure is called "group insert" or "enlargement". One grouping unit is called a group which may be considered to include one of the process units. The group is inserted to establish multi-hierarchical relationships, wherein the groups are hierarchically high level while the process units are hierarchically low level. An object of the enlargement is to develop multi-hierarchy to enlarge the size of the hierarchically low levels.

With reference to FIG. 13, in the circuit analyzing section 102, the hardware description language 101 is read in Step 1201.

In the basic analyzing section 103, basic syntax analysis and meaning analysis are carried out in Step 1202.

In the similar description extraction section 104, the similar descriptions are extracted in Step 1203.

Figure 2:
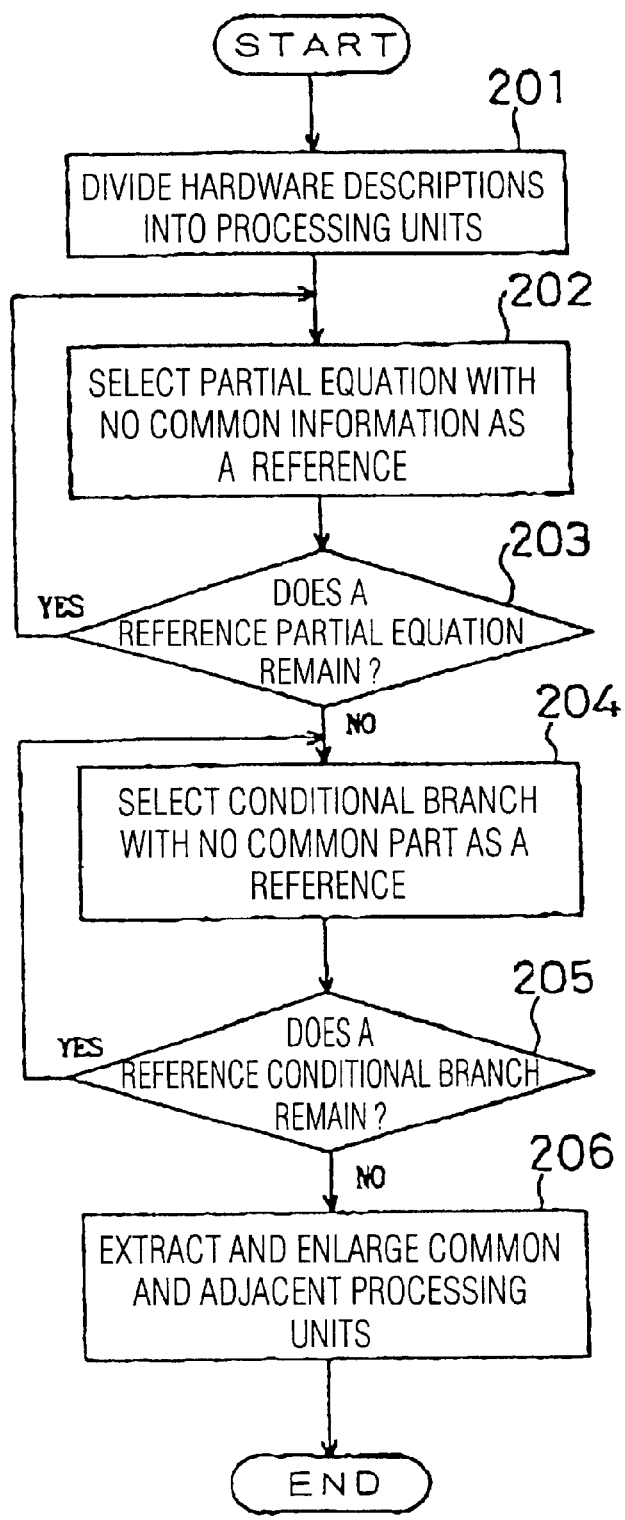
FIG. 2 is a flow chart illustrative of a common part description extraction process in a first embodiment according to the present invention.

With reference to FIG. 2, in Step 201, the equations in the hardware descriptions are divided into processing units with proper sizes in accordance with the degree of complication previously determined for every kind of operation. The degree of complication was already determined by use of literal number or logic stages as indicators and in consideration of the performance of the logic synthesis. The divisional process is carried out to increase an opportunity of commonly processing by making the processing unit uniform in size.

Figure 3A:
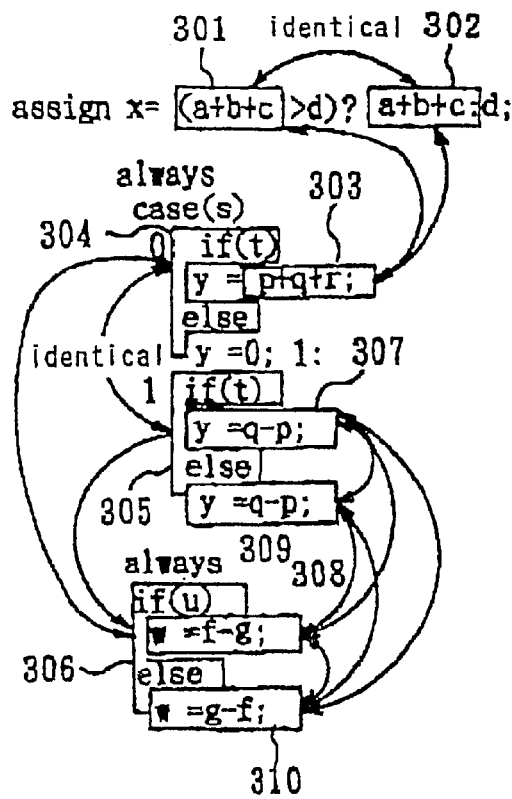
FIG. 3 is a view illustrative of one example of a hardware description in a first embodiment according to the present invention.
Figure 3B:
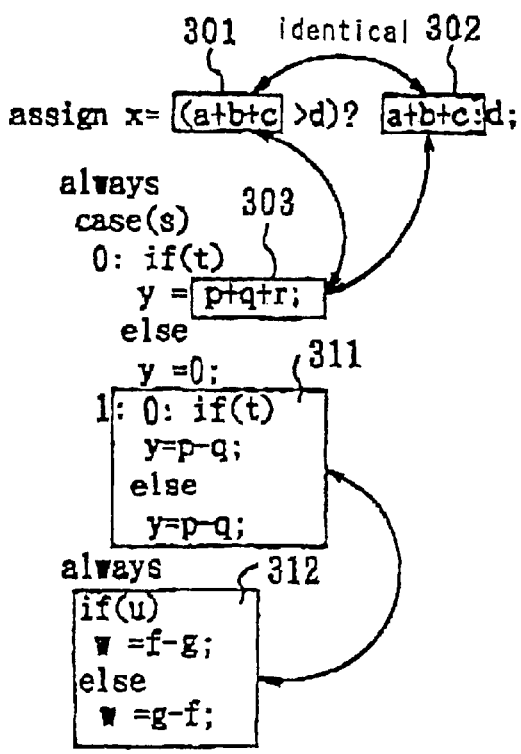

With reference to FIGS. 3A–3B, the process unit 301 is one example obtained by dividing the equation x=(a+b+c>d)?a+b+c:d;.

If the condition a+b+c>d is true, then the substitute x=a+b+c is carried out. If this condition is not satisfied, then x=d is carried out.

With reference back to FIG. 2, in Step 202, a partial equation with no common information is selected from the hardware descriptions as a reference.

In FIGS. 3A–3B, the partial equation 301 is used as a reference. Any common partial equation is found out from the other partial equations having no common partial information and if any common partial equation exists, then the common part information stored in the memory 106. It is found that the partial equation 302 is common to the partial equation 301. "Common part information" is a list of the common processing units.

In Step 203, if any reference partial equation usable as a reference remains, the process enters into Step 202 and if no reference partial equation remains, then process enters into Step 204.

In Step 204, the conditional branch with no common part information is selected from the hardware descriptions as a reference and also a conditional branch is found from the other conditional branches with no common partial information and if any common conditional branch exists, then the common part information is stored in the memory 106.

If in Step 205 the conditional branch as a reference remains, then the processes enters into the Step 204. If no conditional branch remains, then the processes enters into the Step 206.

In Step 206, any common and adjacent processing units are extracted from the common part information stored in the memory 106 and enlarged to form grouped common part information which is to be stored in the memory 106.

The extraction of the common similar descriptions in Step 1203 is completed.

With reference again to FIG. 13, in the low level hierarchy common section 105, the common and similar circuits are transformed in a form that allows common reference at a hierarchically low level in Step 1204.

In the restriction input section 112, restriction conditions 111 such as limitations in maximum area, delay at maximum and minimum, a maximum power and other conditions, are inputted into the memory 106. In the optimization processing section 110, optimization processes are carried out which are least dependent on the boundary conditions having objective functions to adjust to the restriction conditions against the circuit stored in the memory 106 in Step 1205, for example, logical minimizing processes for reduction in literal numbers, technology mapping and a delay optimization for previously shortening the delay.

In the low level hierarchical separation section 107, the hierarchically low levels commonly referenced are separated in Step 1206.

With reference to FIG. 5, the low level hierarchy common section 105 replaces the processing units by instances corresponding to the operations in the circuit data of the memory 106 in accordance with the common part information of the memory 106 so as to form instances at a hierarchically low level at a definition side and also prepare reference relationships in Step 401.

In step 402, a hierachy is developed for the enlarged multi-hierarchy in part or in whole with reference to the number of common references and hierarchical scale as evaluation functions.

Instances with the same inputs and referring to the same hierarchically low level are grouped into one in Step 403.

If there are instances identical in full input or an input more than a constant ratio and referring to the different hierarchically low levels and further if no reference to the hierarchically low levels from the instance with the quite different inputs, then the instances are merged and the hierarchically low levels are merged to form one level in hierarchy in Step 404 so as to facilitate optimization in the hierarchy such as optimizations to the multiple output functions.

The "merge" means collecting two levels into one level to make the same input terminals commonly useable.

The common process of the hierarchically low levels is completed.

In the Step 1207, in the optimization processing section 110, an optimization process is made to the circuits stored in the memory 106, wherein the optimization process is highly dependent on the boundary condition with objective functions to adjust to the restriction conditions, for example, separate delay optimization to instances largely differing in the delay restrictions and delay optimization dependent on the load. capacitance of the hierarchical boundary and fan-out restriction compensation processing.

In Step 1208, a synthesis result is outputted from the output section 108.

The processes described with reference to FIG. 2 are applied to the hardware descriptions to obtain an initial extraction result of FIG. 3A.

Figure 3C:
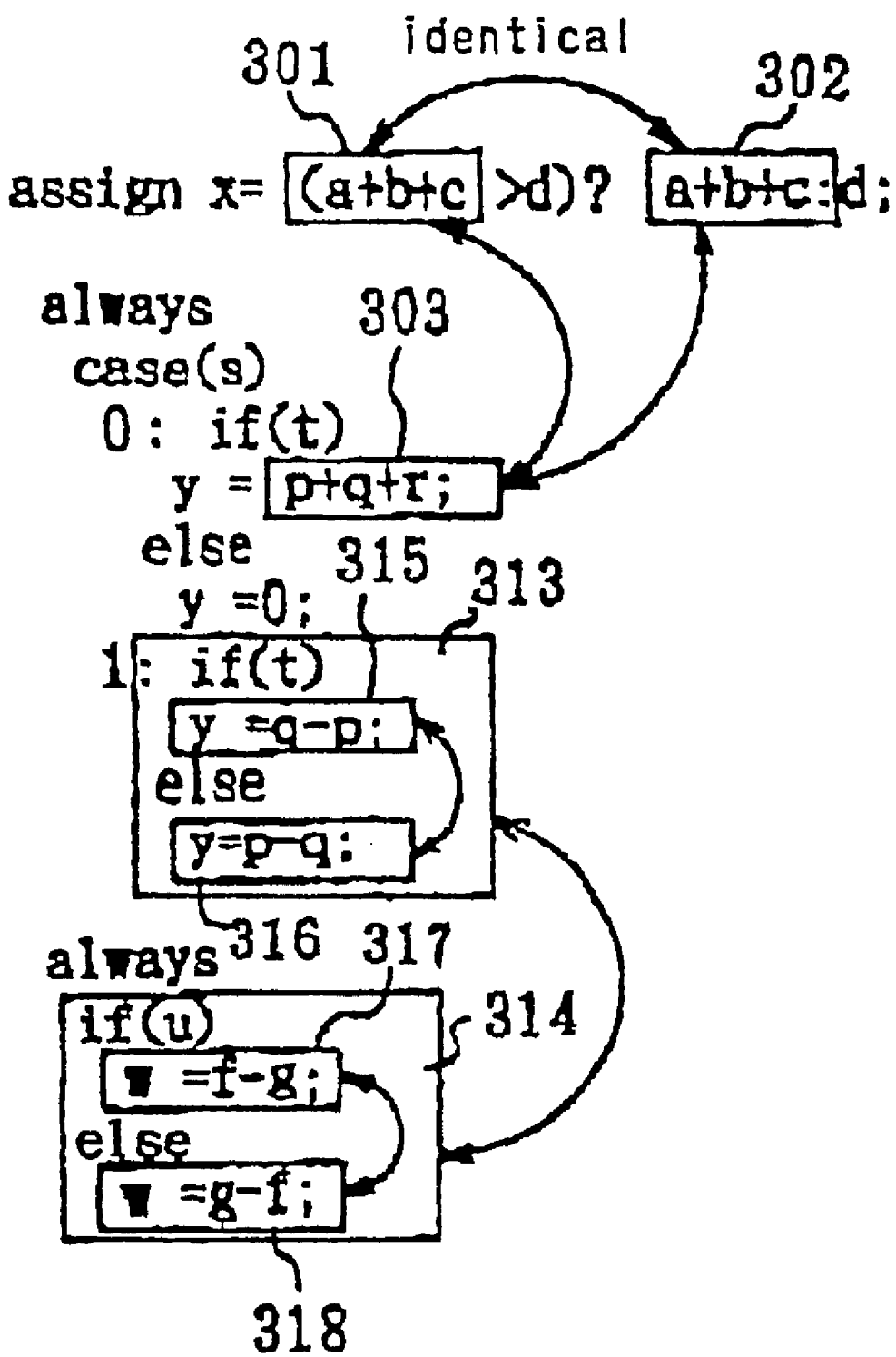

The process in Step 206 is applied to the initial extraction result to obtain the result of FIG. 3C. The processing unit 313 is a grouping of the processing units 305 and 307 adjacent in FIG. 3A and the processing units 305 and 308.

The processing unit 314 is a grouping of the processing units 306 and 309 adjacent in FIG. 3A and the processing units 306 and 310.

In Steps 401–402, judgments are made of the combination and development of levels in hierarchy with reference to the size in one level after development and the number of connection signals connecting the levels. If the multi-development is selected, then the processing units 313, 315 and 316 are developed in FIG. 3C into the processing units 311 in FIG. 3B.

Figure 4A:
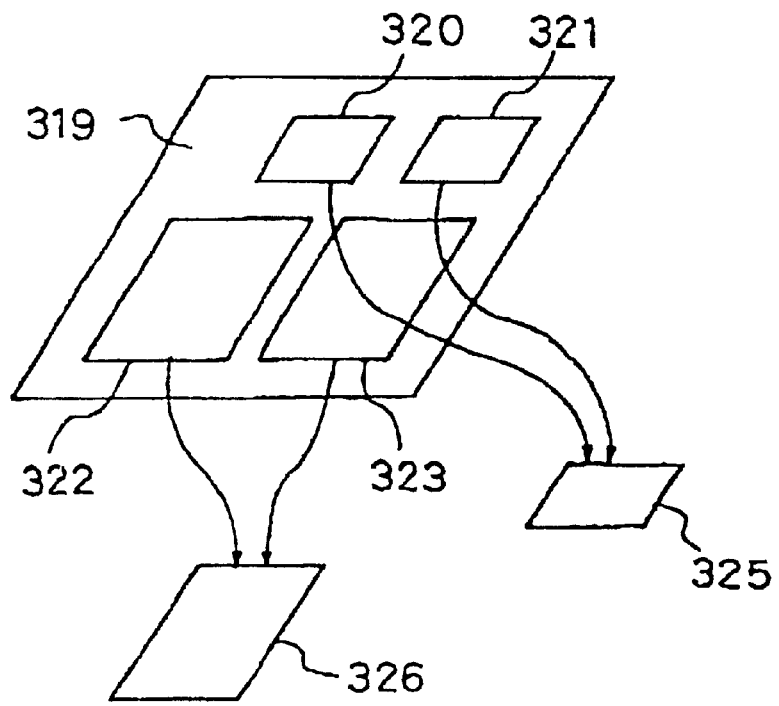
FIGS. 4A and 4B are views illustrative of hierarchical structures in a first embodiment according to the present invention.
Figure 4B:
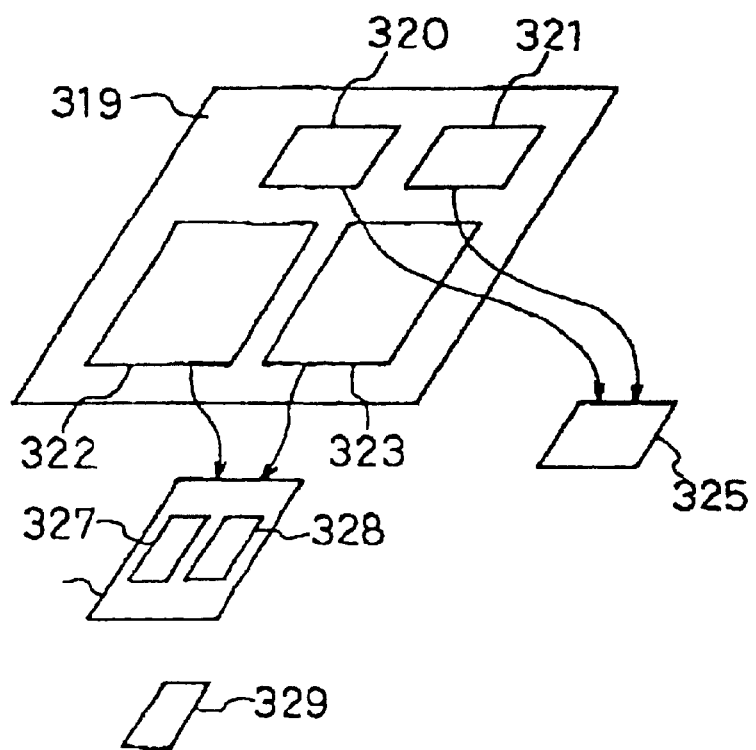

In Step 401, instances 320–323 are prepared in the highest level 319 in hierarchy in FIG. 4B, to form low levels 326 and 325 in hierarchy at the defining side. In the hierarchically low level 326, further instances 327–328 are prepared to form hierarchically low level 329, In Step 402, the hierarchical development is selected to the instances 327–328 on the level 326 with reference to the size of the hierarchically low level.

In Step 403, the processing units 301 and 302 are grouped into a single instance 320. The processing unit 303 is different in input from the processing units 301 and 302, for which reason the processing unit 303 remains as other instance 321.

Figures 7A, 7B:
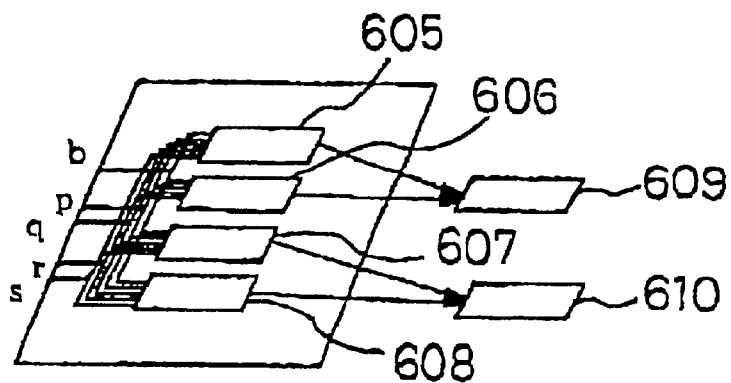
FIG. 7 is a view illustrative of one example of a hierarchical merge in a first embodiment according to the present invention.

The processing unit 601 in FIG. 7A corresponds to the instance 605 in FIG. 7B and the definitive side hierarchically low level 609.

The processing unit 602 corresponds to the instance 606 and the definitive side hierarchically low level 609.

The processing unit 603 corresponds to the instance 607 and the definitive side hierarchically low level 610.

The processing unit 604 corresponds to the instance 608 and the definitive side hierarchically low level 610.

A judgment is made whether common parts of the input signals of the processing units should be merged.

The processing units 601–604 receiving the same inputs "b, p, q, r, s" are judged to be merged.

Figure 7C:
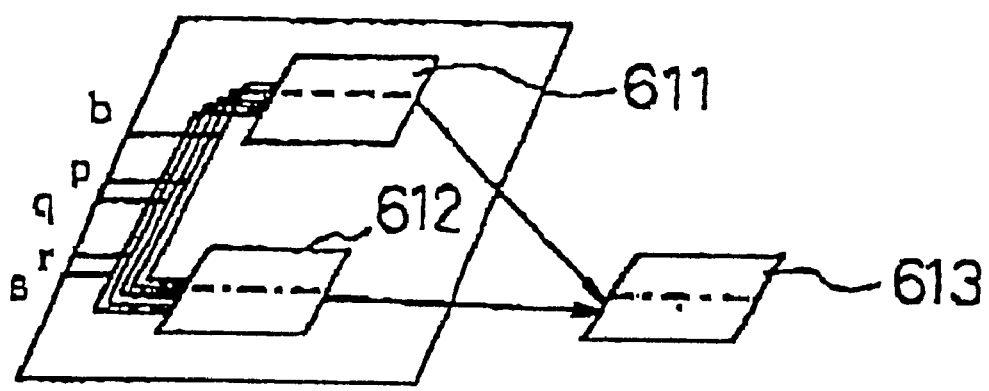

With reference to FIG. 7C, the instances 605 and 607 are merged into an instance 611. The instances 606 and 608 are merged into an instance 612. The instances 609 and 610 are merged into an instance 613.

A second embodiment according to the present invention will be described wherein common circuits are extracted from a gate level netlist and temporary and commonly reference at a hierarchically low level.

Figure 9:
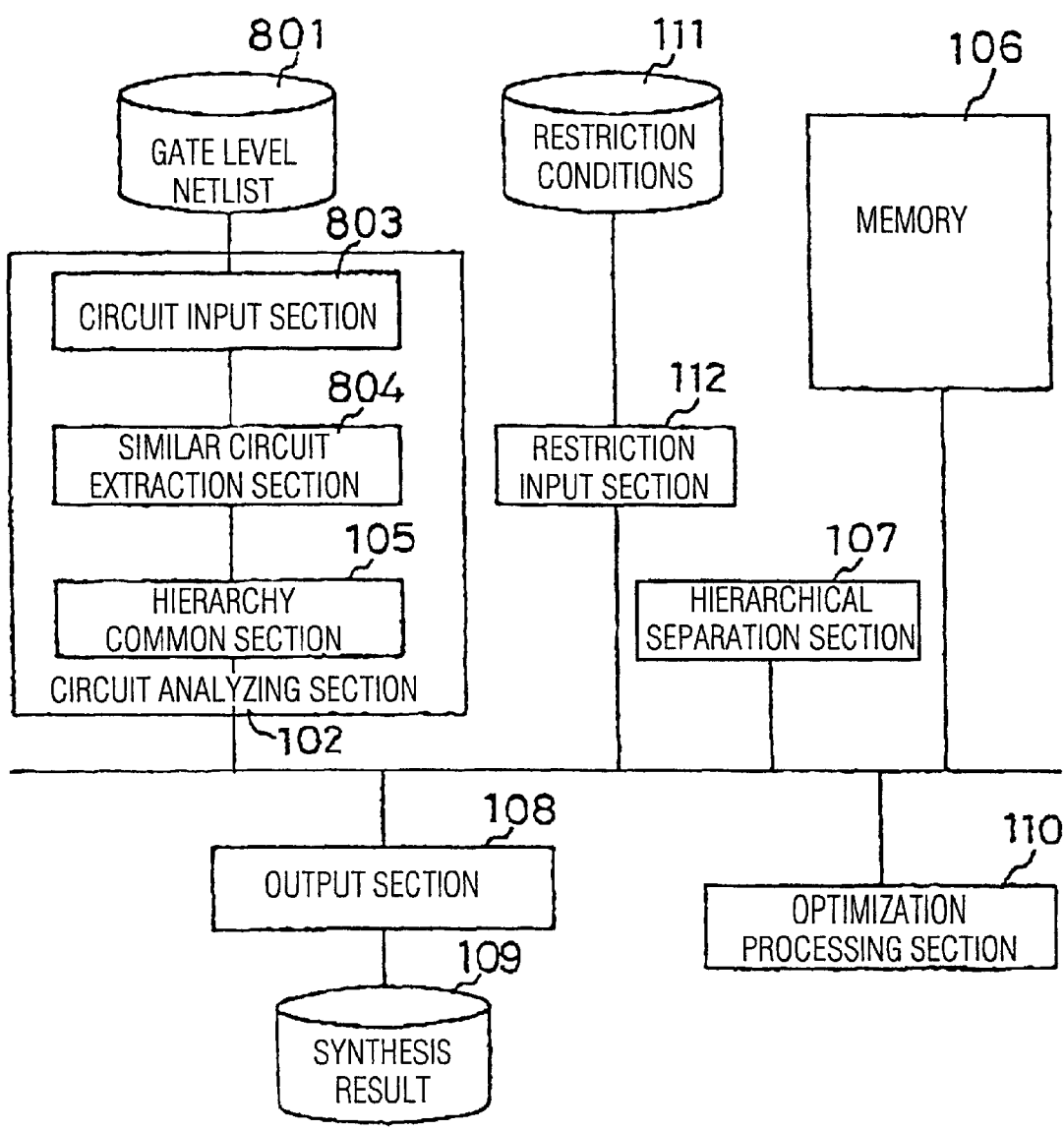
FIG. 9 is a block diagram illustrative of a logic synthesis system in a second embodiment according to the present invention.

With reference to FIG. 9, the structure of the second embodiment is different from the first embodiment in the following ways. In place of the basic analyzing section 103 for basic analysis of the hardware descriptions, a circuit input section 803 is provided for inputting a gate level netlist 801. In place of the similar description extraction section 104 for extracting common and similar descriptions, a similar circuit extraction 804 is provided for extracting common partial circuits.

Figure 14:
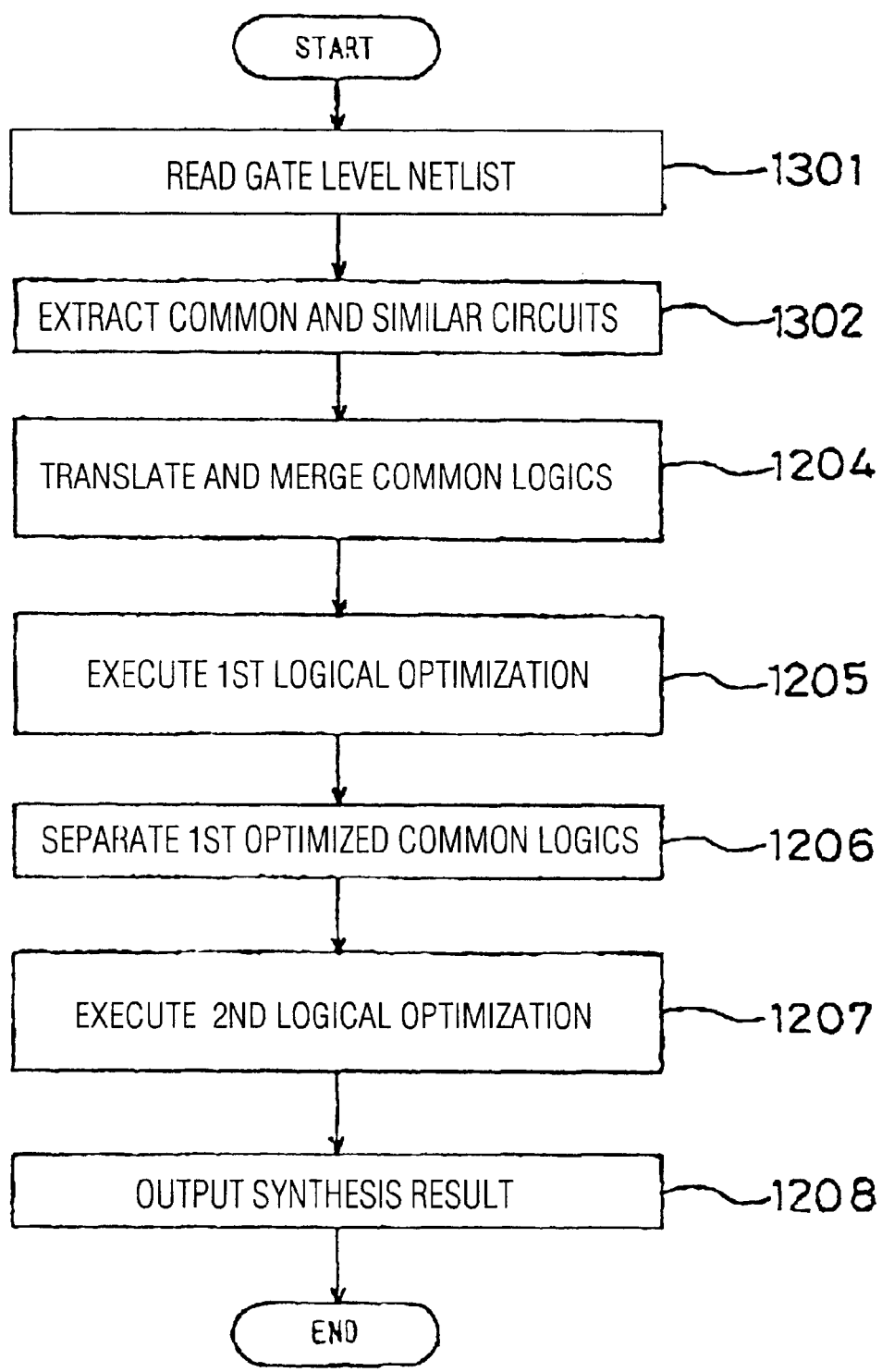
FIG. 14 is a flow chart illustrative of total processes in a second embodiment according to the present invention.

With reference to FIG. 14, in Step 1301, a circuit input analyzing section 802 reads the gate level netlist 801.

In Step 1302, a similar circuit extraction portion 804 extracts a common and similar circuit.

In Step 1302, the similar circuit extraction portion 804 executes as follows.

Figure 10:
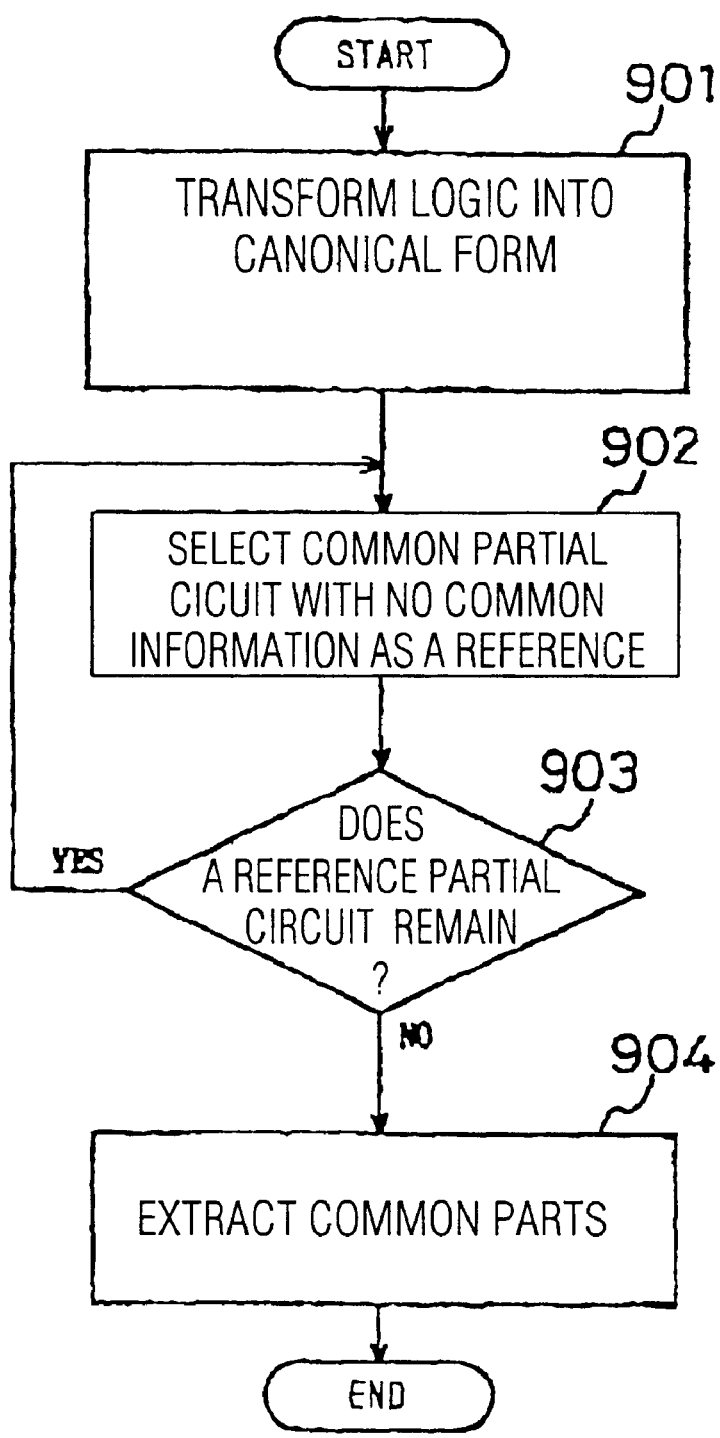
FIG. 10 is a flow chart illustrative of a common part description extraction process in a second embodiment according to the present invention.

With reference to FIG. 10, in Step 901, the logic of the circuit in the memory 106 is transformed into a canonical form such as NAND standard form to be stored in the memory 106. The standard form is used for finding out common parts by pattern matching.

In Step 902, a common partial circuit with no common information is selected from the canonical form logic in the memory 106 as a reference and a common partial circuit is found out by pattern matching from the other partial circuits with no common part informations. If any common circuits exist, then the common part informations are stored in the memory 106.

In Step 903, if the partial circuit remains as a reference, the process enter into the Step 902. If no partial circuit remains, then the process enters into the Step 904.

In Step 904, in the common parts stored in the memory 106, the processing units directly connected or adjacent are extracted to be grouped and then stored in the memory 106.

Other operations are the same as the first embodiment.

The netlist logical equation inputted in step 1301 in FIG. 14 is x=a&bIa&c;

y=p&(qIr);

where x, y are outputs, a,b,c,p,q,r are inputs, & is AND operation, and I is OR operation.

With reference to FIG. 10, in Step 901, the outputs x, y are transformed into canonical forms and given by X=(a nand b) nand (a nand c);

Y=(p nand q) nand (p nand r);

In Step 902, correspondences of a–p, b–q, and c–r are made by pattern matching to confirm the equations of x and y are common and then judgment of the common partial circuit are made.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any s modifications of the present invention which fall within the spirit and scope of the present invention.

What is claimed is:

1. A method of optimization of logic synthesis comprising the steps of:

inputting hardware function operation descriptions for different parts of a single circuit in hardware descriptions language;

extracting common logics from the inputted hardware function operation descriptions for the different parts of the single circuit to translate the common logics into a common reference form at a hierarchically low level;

executing a first logical optimization for the common logics extracted from the different parts of the single circuit;

separating the first optimized common logics; and executing a second logical optimization for each of the separated common logics based on each of boundary conditions of the separated common logics.

2. A method of optimization of logic synthesis comprising the steps of:

inputting gate level net lists for different parts of a single circuit;

extracting common logics from the inputted gate level net lists for the different parts of the single circuit to translate the common logics into a common reference form at a hierarchically low level;

executing a first logical optimization for the common logics extracted from the different parts of the single circuit;

separating the first optimized common logics; and executing a second logical optimization for each of the separated common logics based on each of boundary conditions of the separated common logics.

* * * * *